(12) United States Patent
Chen et al.

(10) Patent No.: US 9,806,142 B2
(45) Date of Patent: Oct. 31, 2017

(54) DISPLAY DEVICE

(71) Applicant: InnoLux Corporation, Miao-Li County (TW)

(72) Inventors: Yun-Sheng Chen, Miao-Li County (TW); Hsia-Ching Chu, Miao-Li County (TW); Ming-Chien Sun, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/155,106

(22) Filed: May 16, 2016

(65) Prior Publication Data

US 2016/0365405 A1 Dec. 15, 2016

(30) Foreign Application Priority Data

Jun. 9, 2015 (CN) .......................... 2015 1 0311577

(51) Int. Cl.
*H01L 29/08* (2006.01)
*H01L 27/32* (2006.01)
*H01L 27/12* (2006.01)

(52) U.S. Cl.
CPC ........ *H01L 27/3276* (2013.01); *H01L 27/124* (2013.01); *H01L 27/1248* (2013.01); *H01L 27/3246* (2013.01)

(58) Field of Classification Search
CPC .............. H01L 27/124; H01L 27/1248; H01L 27/3246; H01L 27/3276
USPC ............... 257/40, 59, 72; 438/155; 349/143; 345/173, 87
See application file for complete search history.

(56) References Cited

U.S. PATENT DOCUMENTS

| | | | |
|---|---|---|---|
| 6,232,937 B1 * | 5/2001 | Jacobsen | G02B 25/002 345/100 |
| 9,082,732 B2 * | 7/2015 | Goto | H01L 27/3218 |
| 9,627,466 B2 * | 4/2017 | Chen | H01L 27/3279 |
| 2003/0146700 A1 * | 8/2003 | Amatsuchi | H01J 11/12 313/582 |
| 2003/0146710 A1 * | 8/2003 | Nakanishi | H01L 27/3223 315/169.3 |
| 2006/0079035 A1 * | 4/2006 | Eguchi | H01L 27/1255 438/155 |
| 2011/0075087 A1 * | 3/2011 | Morinaga | G02F 1/133707 349/143 |
| 2011/0096280 A1 * | 4/2011 | Ki | G02F 1/134336 349/143 |

(Continued)

*Primary Examiner* — Mohammed Shamsuzzaman
(74) *Attorney, Agent, or Firm* — Bacon & Thomas, PLLC

(57) ABSTRACT

A display device comprising: a substrate with a display region and a border region; a first metal layer disposed on the substrate; a first insulating layer disposed on the first metal layer and having a first contact via on the border region; a second metal layer disposed on the first insulating layer and in the first contact via to electrically connect to the first metal layer; a second insulating layer disposed on the second metal layer; a first electrode layer disposed on the second insulating layer and having a first opening; a third insulating layer disposed on the first electrode layer and has a second opening on the border region; and a second electrode layer disposed on the third insulating layer and in the second opening to electrically connect to the first electrode layer, wherein the first contact via corresponds to the first opening, is disclosed.

10 Claims, 7 Drawing Sheets

(56) References Cited

U.S. PATENT DOCUMENTS

| | | | | |
|---|---|---|---|---|
| 2011/0181816 A1* | 7/2011 | Kang | ................ | G02F 1/133345 349/106 |
| 2011/0291097 A1* | 12/2011 | Ogasawara | ........... | G02F 1/1339 257/59 |
| 2014/0319530 A1* | 10/2014 | Chung | ............. | G02F 1/134363 257/72 |
| 2014/0367659 A1* | 12/2014 | Cho | ................... | H01L 27/3276 257/40 |
| 2015/0331508 A1* | 11/2015 | Nho | ..................... | G06F 3/0421 345/173 |
| 2016/0087022 A1* | 3/2016 | Tsai | ................... | H01L 27/3276 257/40 |
| 2016/0126256 A1* | 5/2016 | Hwang | ............. | G02F 1/134363 257/72 |
| 2016/0293688 A1* | 10/2016 | Chen | .................. | H01L 27/3279 |

\* cited by examiner

DISPLAY DEVICE

CROSS REFERENCE TO RELATED APPLICATION

This application claims the benefits of the Chinese Patent Application Serial Number 201510311577.9, filed on Jun. 9, 2015, the subject matter of which is incorporated herein by reference.

BACKGROUND OF THE INVENTION

1. Field of the Invention

The present invention relates to a display device and, more particularly, to a display device that circuits of a thin film transistor substrate have specific structures on a border region to decrease the parasitic capacitance thereof.

2. Description of Related Art

In recent years, all the display devices are developed toward having small volume, thin thickness and light weight as the display techniques progresses. Hence, a conventional cathode ray tube (CRT) display is gradually replaced by a liquid crystal display (LCD) device or an organic light emitting diode (OLED) display device. The OLED display devices can be applied to various fields. For example, the daily used devices such as cell phones, notebooks, video cameras, cameras, music players, navigation devices, and televisions are equipped with the flat panel display devices.

Although the OLED display devices are commercially available, every manufacturer is desired to develop display devices with improved display quality to meet customers' requirement as the display devices developed. In particular, the structure of the circuits on the TFT substrate is one factor related to the display quality.

Even though the OLED display devices are well developed and commercialized, it is still necessary to develop a display device with improved display quality to meet the customers' requirement.

SUMMARY OF THE INVENTION

The object of the present invention is to provide a display device, wherein parasitic capacitance between the metal layer and the electrode layer is reduced, and coupling therebetween is also decreased. Therefore, the undesirable influence between these two layers can be diminished to further improve the display quality of the display device.

The display device provided by the present invention comprises: a substrate with a display region and a border region surrounding the display region; a first metal layer disposed on the substrate; a first insulating layer disposed on the first metal layer and having a first contact via on the border region; a second metal layer disposed on the first insulating layer and in the first contact via to electrically connect to the first metal layer; a second insulating layer disposed on the second metal layer; a first electrode layer disposed on the second insulating layer and having at least one first opening on the border region; a third insulating layer disposed on the first electrode layer and having a second opening on the border region; and a second electrode layer disposed on the third insulating layer and in the second opening to electrically connect to the first electrode layer, wherein the first contact via corresponds to the first opening.

In addition, the present invention further provides another display device, which comprises: a substrate with a display region and a border region surrounding the display region; a first metal layer disposed on the substrate; a second metal layer disposed on the first metal layer; a first insulating layer disposed between the first metal layer and the second metal layer, wherein the first insulating layer has a first contact via, and the second metal layer is disposed in the first contact via to electrically connect to the first metal layer; a second insulating layer disposed on the second metal layer; a first electrode layer disposed on the second insulating layer and having a first opening on the border region; a second electrode layer disposed on the first electrode layer; and a third insulating layer disposed between the first electrode layer and the second electrode layer, and further disposed in the first opening to contact with the second insulating layer, wherein the first contact via corresponds to the first opening.

In the display device of the present invention, in a cross-section of the display device, the first opening has a first side and a second side opposite to the first side, the first contact via has a third side and a fourth side opposite to the third side, the first side is relatively close to the third side, the second side is relatively close to the fourth side, and a distance between the first side and the third side is different from that between the second side and the fourth side.

In the display panel of the present invention, in a cross-section of the display device, the first opening has a first central line, the first contact via has a second central line, and the first central line is not overlapped with the second central line.

In the display panel of the present invention, the second opening and the first opening are not aligned to each other.

In the display panel of the present invention, the third insulating layer further has a third opening, and the first opening locates between the second opening and the third opening. In a cross-section of the display device, the first opening has a first side and a second side opposite to the first side, and the third insulating layer covers the first electrode layer and has a curved surface between the second opening and the third opening. Herein, in the cross-section of the display device, the curved surface has a first end and a second end, a first distance is between the first end and the first side, a second distance is between the second end and the second side, and the first distance and the second distance are different.

In addition, in the display device of the present invention, a thickness of the second electrode layer on the third insulating layer is different from another thickness thereof in the second opening.

Furthermore, the display device of the present invention is an OLED display device.

In general, the electrode layer and the metal layer are partially overlapped, and parasitic capacitance generated in the overlapped region may cause resistance-capacitance (RC) delay of signal transmission; and the influence generated by the parasitic capacitance may deteriorate the display quality of the display device. Hence, in the display device of the present invention, the opening of the electrode layer is not aligned with the contact via of the metal layer below in the border region thereof. Especially, there is no electrode disposed above the contact via of the metal layer; therefore, the parasitic capacitance between the electrode layer and the metal layer therebelow can be decreased to reduce the undesirable influence caused by the parasitic capacitance and further improve the display quality of the display device.

Other objects, advantages, and novel features of the invention will become more apparent from the following detailed description when taken in conjunction with the accompanying drawings.

DETAILED DESCRIPTION OF THE PREFERRED EMBODIMENT

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

Figure 1:
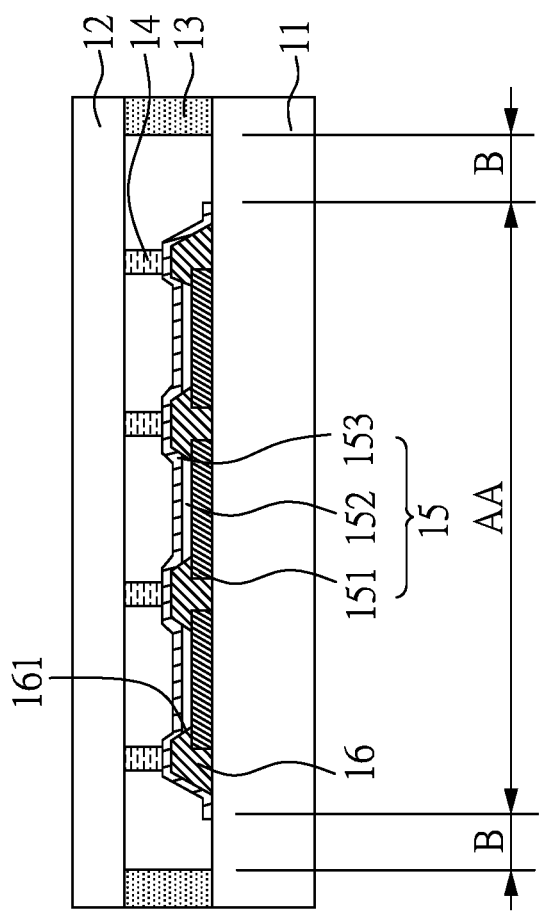
FIG. 1 is a cross-sectional view of an OLED display device according to one embodiment of the present invention.

FIG. 1 is a cross-sectional view of an OLED display device according to one embodiment of the present invention. During the process for manufacturing the OLED display device, a first substrate 11 and a second substrate 12 are firstly provided. Organic light emitting diode (OLED) units 15 and pixel defining layers 16 are disposed on the first substrate 11, wherein each pixel defining layer 16 is disposed between two adjacent OLED units 15. In addition, plural spacers 14 are disposed on the second substrate 12, and a sealant 13 (a frit sealant in the present embodiment) is formed on a periphery of the second substrate 12 in advance, which is formed through a dispensing process and a sintering process to be fixed on the second substrate 12. Then, the first substrate 11 is assembled with the second substrate 12, wherein the spacers 14 on the second substrate 12 correspond to regions outside the pixel opening 161 of the pixel defining layer 16. After the sealant 13 is adhered onto the first substrate 11 through a laser process, an OLED display device of the present embodiment is obtained.

Figure 2:
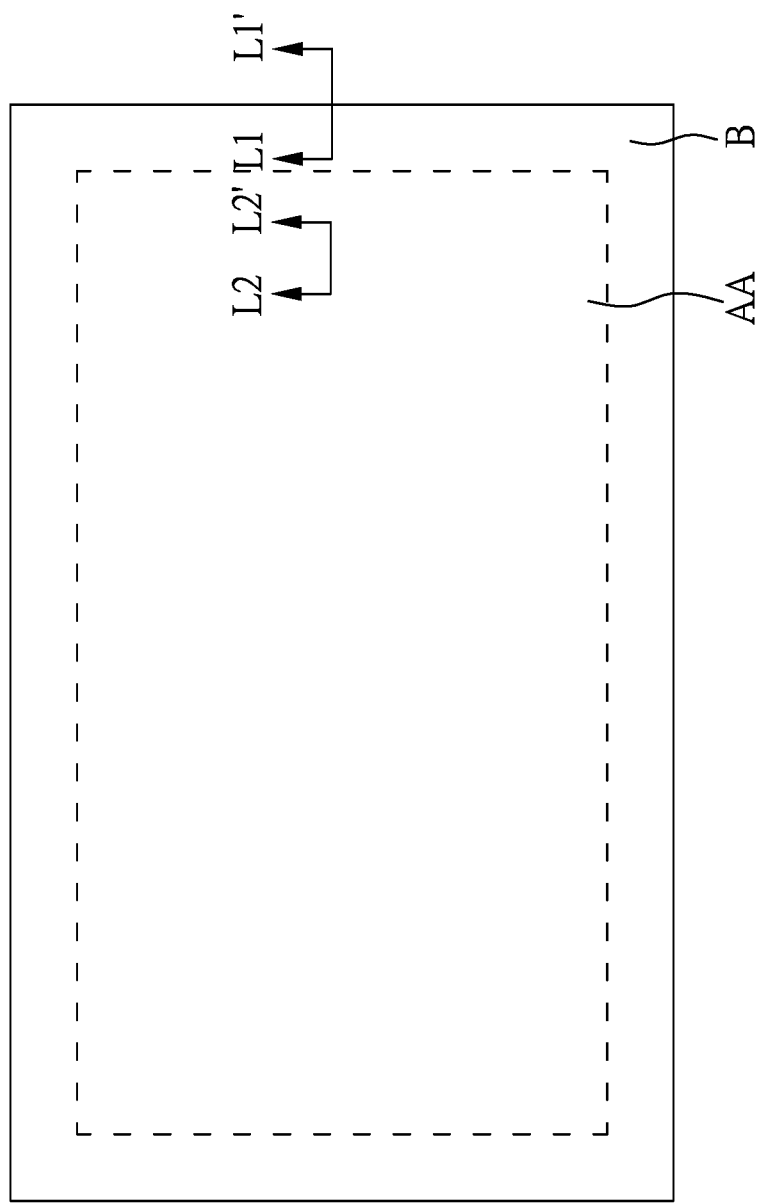
FIG. 2 is a top view of an OLED display device according to one embodiment of the present invention.

In the present embodiment, both the first substrate 11 and the second substrate 12 are glass substrates. In addition, as shown in FIGS. 1 and 2, the OLED display device of the present embodiment comprises a display region AA and a border region B, wherein the border region B is a region with circuits formed thereon, and the display region AA is a region with the aforementioned OLED units 15 and TFT units (not shown in the figure) formed thereon. Furthermore, in the present embodiment, the OLED units 15 can respectively emit red, green and blue light; but the present invention is not limited thereto. For example, the OLED units 15 can be white OLED units, and a color filter unit (not shown in the figure) is further disposed on a side of the first substrate 11 or the second substrate 12.

In addition, as shown in FIG. 1, in the OLED display device of the present embodiment, the OLED units 15 comprise a first electrode 151, an organic display medium 152 and a second electrode 153 sequentially laminated on the first substrate 11. Herein, the first electrode 151 electrically connects to the TFT units (not shown in the figure) on the first substrate 11. The pixel defining layer 16 is disposed between the first electrode 151 and the organic display medium 152, and a light emitting region is defined by the pixel opening 161 of the pixel defining layer 16. Herein, only the OLED unit comprising the first electrode 151, the organic display medium 152 and the second electrode 153 is present, but the present invention is not limited thereto. Other OLED units can also be applied to the OLED display device of the present invention, for example, the OLED unit comprising an electron transporting layer, an electron injection layer, a hole transporting layer, a hole injection layer, and/or other layers capable of facilitating the combination of holes and electrons.

Figure 3:
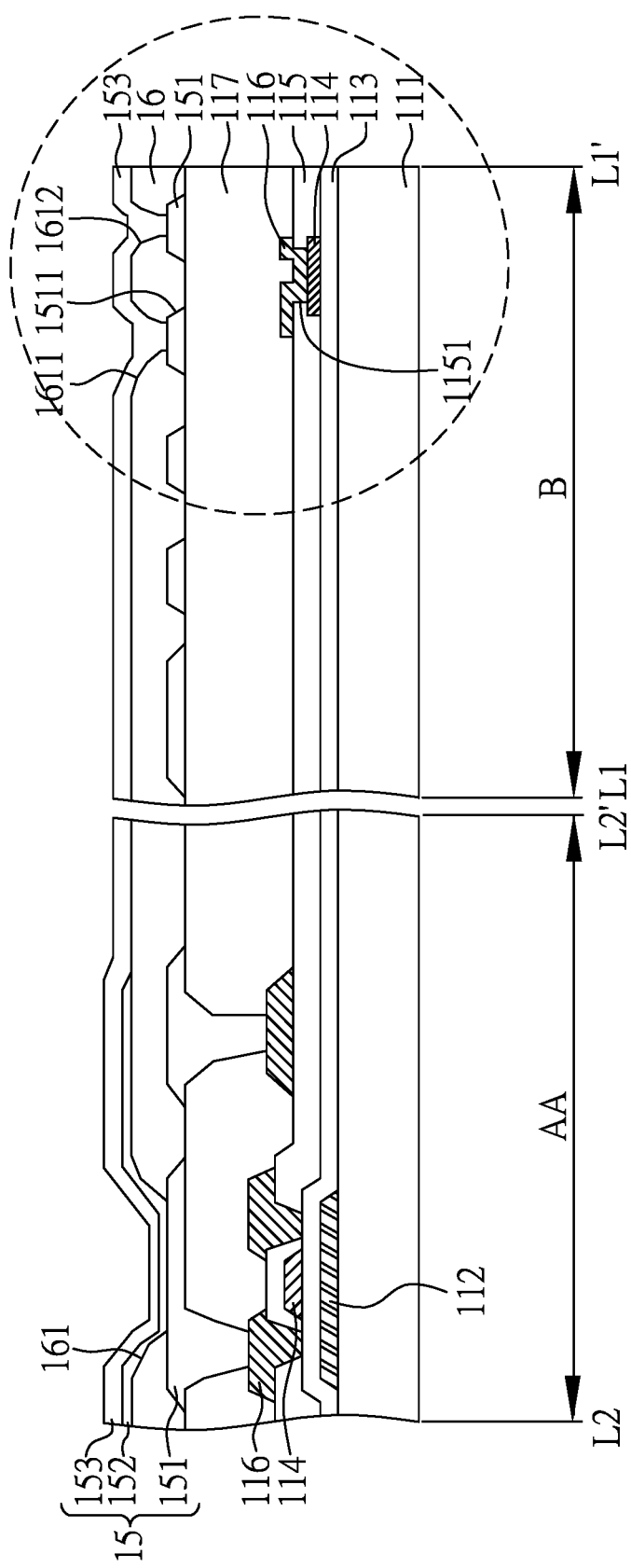
FIG. 3 is a cross-sectional view of an OLED display device along the lines L1-L1' and L2-L2' shown in FIG. 2, according to one embodiment of the present invention.

Hereinafter, the structures of the circuits on the display region AA and the border region B and the manufacturing method thereof are illustrated below in detail. FIG. 3 is a cross-sectional view of the OLED display device along the lines L1-L1' and L2-L2' shown in FIG. 2. Herein, the OLED display device of the present embodiment comprises: a substrate 111 (equal to the first substrate 11 shown in FIG. 1), which has a display region AA and a border region B surrounding the display region AA.

In the display region AA, a TFT unit is formed on the substrate 111, and the manufacturing method thereof is briefly described below. First, a first substrate 11 is provided, and an active layer 112 is further formed thereon. In the present embodiment, the active layer 112 is made of polysilicon formed by annealing amorphous silicon. Then, an insulating layer 113, a first metal layer 114 and a first insulating layer 115 are sequentially formed on the substrate 111. Herein, the first metal layer 114 in the display region AA is used as a gate electrode; the insulating layer 113 is used as a gate electrode layer which can be made of an insulating material such as silicon oxide or silicon nitride; and the first insulating layer 115 may also be made of the aforementioned insulating material. Then, a second metal layer 116 is formed on the first insulating layer 115. Herein, the second metal layer 116 in the display region AA further penetrates through the first insulating layer 115 to serve as a source electrode and a drain electrode. After the aforementioned steps, a TFT substrate of the present embodiment is obtained.

In the present embodiment, the TFT unit on the TFT substrate is a low temperature poly-silicon (LTPS) TFT unit. However, in other embodiment of the present invention, the structure of the TFT unit is not limited to that shown in FIG. 3. In addition, in other embodiment of the present invention, the TFT unit does not only comprise the layers shown in FIG. 3, and may also comprise other layers such as buffer layers and other insulating layers, to increase the adhesion between layers and the electricity of the TFT unit.

Furthermore, in the step for forming the TFT unit in the display region AA, other circuits also form on the border region B. As shown in FIG. 3, through the same process for forming the TFT unit, a first metal layer 114, a first insulating layer 115 and a second metal layer 116 are sequentially formed on the border region B of the first substrate 11, wherein the first metal layer 114 is disposed on the first substrate 11, the first insulating layer 115 is disposed on the first metal layer 114 and has a first contact via 1151, and the second metal layer 116 is disposed on the first insulating layer 115 and in the first contact via 1151 to electrically connect to the first metal layer 114.

As shown in FIG. 3, after forming the second metal layer 116, a second insulating layer 117, a first electrode layer 151, a pixel defining layer 16, an organic display medium 152 and a second electrode layer 153 are sequentially formed on the display region AA of the first substrate 11, to accomplish the OLED unit 15 of the present embodiment. Herein, the second insulating layer 117 can be made of a material for forming a planer layer; the pixel defining layer 16 can be formed with an insulating material, and a pixel opening 161 is formed in the pixel defining layer 16 by a patterning process to define the light emitting region; the first electrode layer 151 can be a reflective electrode or a transparent electrode (for example, the reflective electrode); and the second electrode layer 153 can be a transparent electrode or a semi-transparent electrode. The materials for the reflective electrodes may be Ag, Ge, Al, Cu, Mo, Ti, Sn, AlNd, ACX or APC, the materials for the transparent electrodes may be transparent conductive oxides (TCO) such as ITO and IZO, and the semi-transparent electrodes may be metal thin film electrodes such as Mg/Ag alloy thin film electrodes, Au thin film electrodes, Pt thin film electrodes and Al thin film electrodes. In addition, the second electrode 153 used herein can be a composite electrode of a transparent electrode and a semi-transparent electrode (for example, a composite electrode of a TCO electrode and a Pt thin film electrode), if it is needed.

Similarly, after forming the second metal layer 116, the aforementioned second insulating layer 117, the first electrode layer 151, the pixel defining layer 16 and the second electrode layer 153 are also formed on the border region B of the first substrate 11. Herein, the first electrode layer 151 is patterned to have a first opening 1511, and the pixel defining layer 16 is patterned to have a second opening 1611 and a third opening 1612.

In the present embodiment, the aforementioned layers are prepared through a patterning process to have specific patterns including openings.

After the aforementioned process, as shown in FIG. 3, in the border region B of the OLED display device of the present embodiment, the device comprises: a first metal layer 114 disposed on first substrate 11; a first insulating layer 115 disposed on the first metal layer 114 and having a first contact via 1151 on the border region B; a second metal layer 116 disposed on the first insulating layer 115 and the first metal layer 114 and also in the first contact via 1151 to electrically connect to the first metal layer 114, wherein the first insulating layer 115 is disposed between the first metal layer 114 and the second metal layer 116; a second insulating layer 117 disposed on the second metal layer 116; a first electrode layer 151 disposed on the second insulating layer 117 and having at least one first opening 1511 on the border region B; a third insulating layer (i.e. the pixel defining layer 16) disposed on the first electrode layer 151 and having a second opening 1611 on the border region B; and a second electrode layer 153 disposed on the third insulating layer (i.e. the pixel defining layer 16) and the first electrode layer 151 and also in the second opening 1611 to electrically connect to the first electrode layer 151, wherein the third insulating layer (i.e. the pixel defining layer 16) is disposed between the first electrode layer 151 and the second electrode layer 153, and further disposed in the first opening 1511 to contact with the second insulating layer 117.

Figure 4:
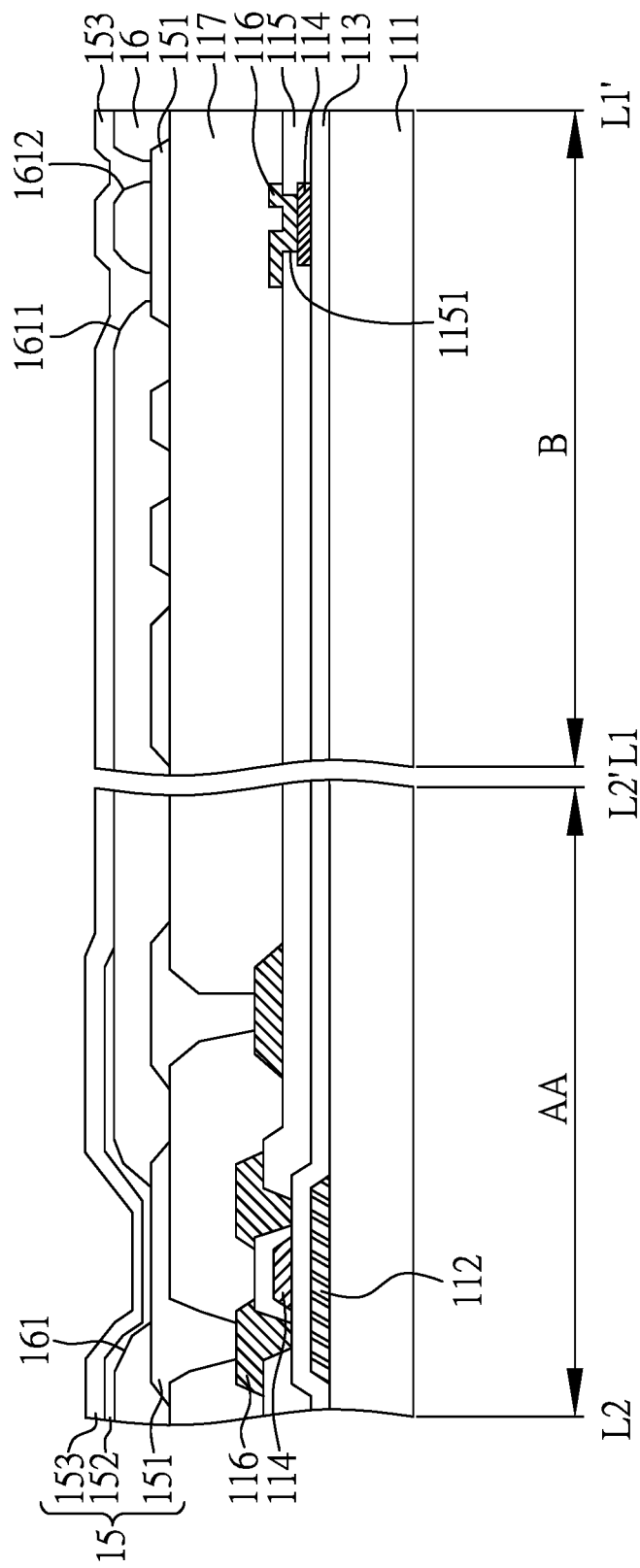
FIG. 4 is a cross-sectional view of an OLED display device along the lines L1-L1' and L2-L2' shown in FIG. 2, according to a comparative embodiment of the present invention.

As shown in FIG. 3, on the border region B of the OLED display device of the present embodiment, the first contact via 1151 corresponds to the first opening 1511. Compared with the display device without the first opening 1511 corresponding to the first contact via 1151 (as shown in FIG. 4), the first opening 1511 is formed in the first electrode layer 151 of the device of the present embodiment to decrease the capacitance in this region.

More specifically, the capacitance (C) in this region is related to the overlapping area (A) between the second metal layer 116 and the first electrode layer 151, the dielectric constant (k) of the second insulating layer 117 and the thickness (d) of the second insulating layer 117, and the equation is C=k*A/d. The parasitic capacitance generated in the overlapping portion between the second metal layer 116 and the first electrode layer 151 may cause RC delay of signal transmission; and the influence generated by the parasitic capacitance may deteriorate the display quality of the display device. Hence, in the present embodiment, the overlapping region between the second metal layer 116 and the first electrode layer 151 is reduced to decrease the parasitic capacitance therebetween. To accomplish the purpose of reducing the overlapping region therebetween, the first electrode layer 151 is not formed directly above the first contact via 1151; thus, the area of the first electrode layer 151 above the second metal layer 116 can be reduced to decrease the parasitic capacitance between the first electrode layer 151 and the second metal layer 116. Hence, the influence between these two layers can be diminished to further improve the electricity of the circuits and the display quality of the display device.

Figure 5:
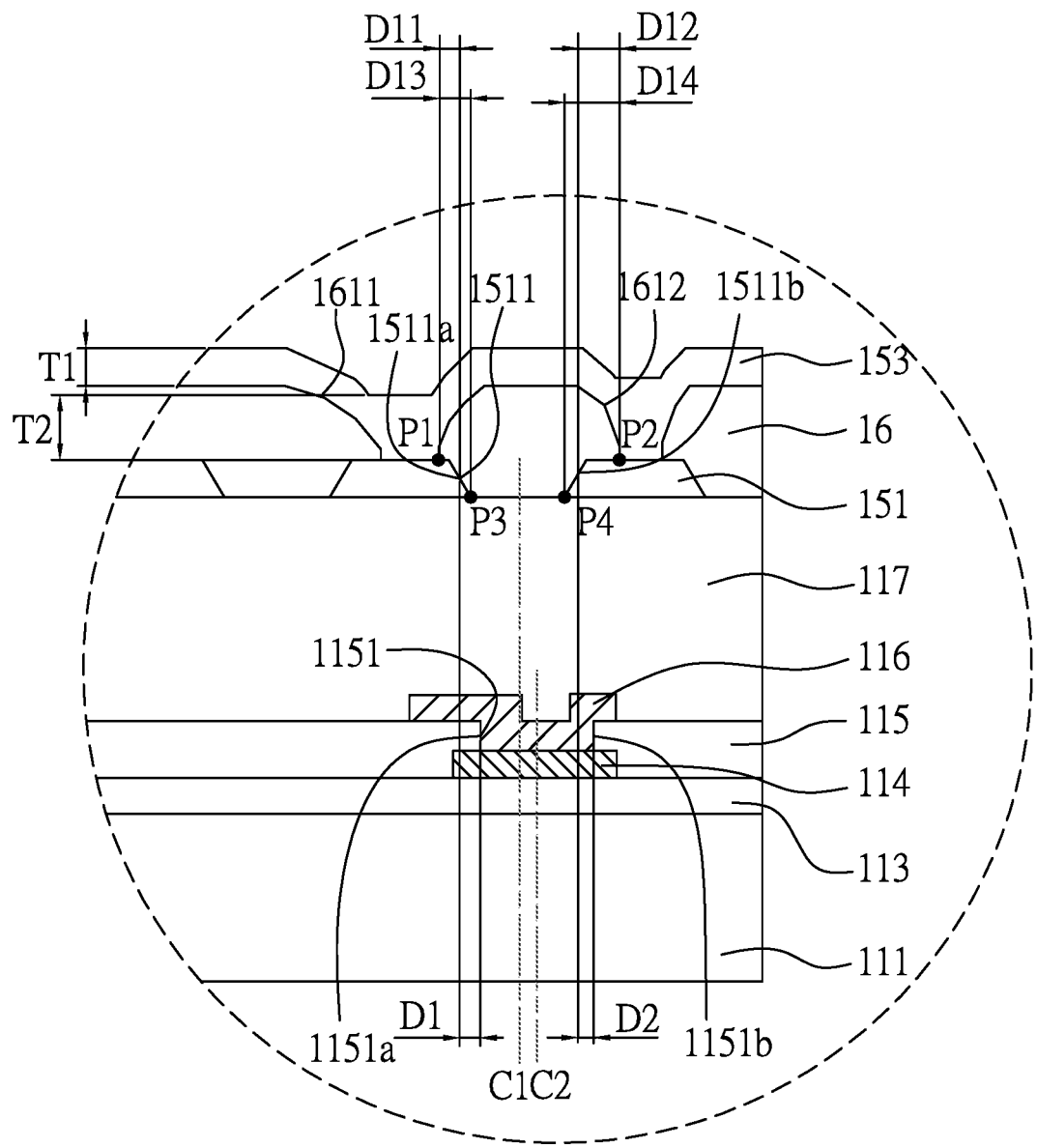
FIG. 5 is an enlarged view of the region indicated by the dot circle shown in FIG. 3.

FIG. 5 is an enlarged view of the region indicated by the dot circle shown in FIG. 3. In a cross-section of the display device along the line L1-L1' indicated in FIG. 2, the first opening 1511 has a first side 1511a and a second side 1511b opposite to the first side 1511a, the first contact via 1151 has a third side 1151a and a fourth side 1151b opposite to the third side 1151a, the first side 1511a is relatively close to the third side 1151a, the second side 1511b is relatively close to the fourth side 1151b, and a distance D1 between the first side 1511a and the third side 1151a is different from a distance D2 between the second side 1511b and the fourth side 1151b. In the present embodiment, the distance D1 between the first side 1511a and the third side 1151a is longer than the distance D2 between the second side 1511b and the fourth side 1151b. However, in other embodiment of the present invention, the distance D1 between the first side 1511a and the third side 1151a may be shorter than the distance D2 between the second side 1511b and the fourth side 1151b. In addition, in a cross-section of the display device along the line L1-L1' indicated in FIG. 2, the first opening 1511 has a first central line C1, the first contact via 1151 has a second central line C2, and the first central line C1 is not overlapped with the second central line C2. In other words, in the case that the distance D1 between the first side 1511a and the third side 1151a is different from the distance D2 between the second side 1511b and the fourth side 1151b and/or the first central line C1 is not overlapped with the second central line C2, it indicates that the first contact via 1151 and the first opening 1511 are not aligned to each other. Under the consideration for the circuit design of the second metal layer 116 near to the first contact via 1151, since the second metal layer 116 has to connect to other layers and the first contact via 1151 has to be disposed below the first opening 1511 of the first electrode layer 151 to decrease the parasitic capacitance, a length of one side of the second metal layer 116 has to be longer than that of another side to connect to other layers. For example, in FIG. 5, the length of the left side of the second metal layer 116 near to the first contact via 1151 is longer than that of the right side thereof. Hence, the first contact via 1151 corresponding to the second metal layer 116 may be shifted to one side, and thus the first contact via 1151 and the first opening 1511 of the first electrode layer 151 are not aligned together.

In the present embodiment, when the first side 1511a, the second side 1511b, the third side 1151a and/or the fourth side 1151b are not a vertical wall but an inclined wall, a curved wall or an irregular wall, the terms "the distance D1 between the first side 1511a and the third side 1151a" and "the distance D2 between the second side 1511b and the fourth side 1151b" refers to a distance between the first contact via 1151 and the first opening 1511 at the positions having the half thicknesses of the sidewalls.

In addition, as shown in FIG. 5, the second opening 1611 of the third insulating layer (i.e. the pixel defining layer 16) and the first opening 1511 of the first electrode layer 151 are not aligned together. Similarly, the third opening 1612 of the third insulating layer (i.e. the pixel defining layer 16) and the first opening 1511 of the first electrode layer 151 are not aligned together. On the border region B of the OLED display device, the first electrode layer 151 has to connect to the second electrode 153 on the third insulating layer (i.e. the pixel defining layer 16), so the third insulating layer (i.e. the pixel defining layer 16) has to have the second opening 1611. In general, if a signal is directly applied to the second electrode 153, the second electrode 153 has to be patterned to form an electric pad so that the signal transmitted from an IC or a flexible printed circuit board (FPC) can be transmitted to the second electrode 153. However, during the process for forming the OLED display device, the second electrode 153 is usually very thin (in the present embodiment, the second electrode 153 is a MgAg electrode having a thickness of about 200 Å), so most of the light emitting from the organic display medium can pass through the second electrode 153. Hence, the second electrode 153 can only be formed through a sputtering process with a metal mask for defining a sputtering region. However, this sputtering process cannot be used to form fine electric pads, so it is difficult to electrically connect the second electrode 153 to the IC or the FPC directly. Even though it is possible to form electric pads on the second electrode 153, the resistance of the second electrode 153 may also be increased. Hence, in the present embodiment, the second electrode 153 is designed to contact to the first electrode 151, to conduct to connecting pads of the IC or the FPC on the display panel. Thus, the signals from the connecting pads of the IC or the FPC can be transmitted to the second electrode 153 through the first electrode 15 contacting with the second electrode 153. Therefore, in the present embodiment, the second opening 1611 and the third opening 1612 of the third insulating layer (i.e. the pixel defining layer 16) are not aligned with the first opening 1511 of the first electrode layer 151, that is, the first opening 1511 locates between the second opening 1611 and the third opening 1612; thus, the first electrode layer 151 can be electrically connected to the second electrode 153. Even though the second electrode 153 is thin and has low resistance, the signal from the IC or the FPC can also be transmitted to the second electrode 153.

Furthermore, as shown in FIG. 5, in the cross-section of the display device along the line L1-L1' indicated in FIG. 2, the third insulating layer (i.e. the pixel defining layer 16) covers the first electrode layer 151 and has a curved surface between the second opening 1611 and the third opening 1612. Herein, the curved surface has a first end P1 and a second end P2, the first end P1 is relatively close to the first side 1511a, and the second end P2 is relatively close to the second side 1511b. A first distance D11 is between the first end P1 and the first side 1511a, a second distance D12 is between the second end P2 and the second side 1511b, and the first distance D11 and the second distance D12 are different. Similarly, as mentioned above, when the first side 1511a and the second side 1511b are not a vertical wall but an inclined wall, a curved wall or an irregular wall, the terms "the first distance D11 is between the first end P1 and the first side 1511a" and "the second distance D12 is between the second end P2 and the second side 1511b" refers to the distances between the first end P1/the second end P2 and the two sidewalls of the first opening 1511 at the positions having the half thickness of the first opening 1511.

Moreover, a third distance D13 is between the first end P1 and an end P3 that the first side 1511a contacts to the second insulating layer 117, a fourth distance D14 is between the second end P2 and an end P4 that the second side 1511b contacts to the second insulating layer 117, and the third distance D13 and the fourth distance D14 are different.

In addition, as shown in FIG. 5, in the cross-section of the display device along the line L1-L1' indicated in FIG. 2, a thickness T1 of the second electrode 153 on the third insulating layer (i.e. the pixel defining layer 16) is different from another thickness T2 thereof in the second opening 1611 or the third opening 1612.

Figure 6:
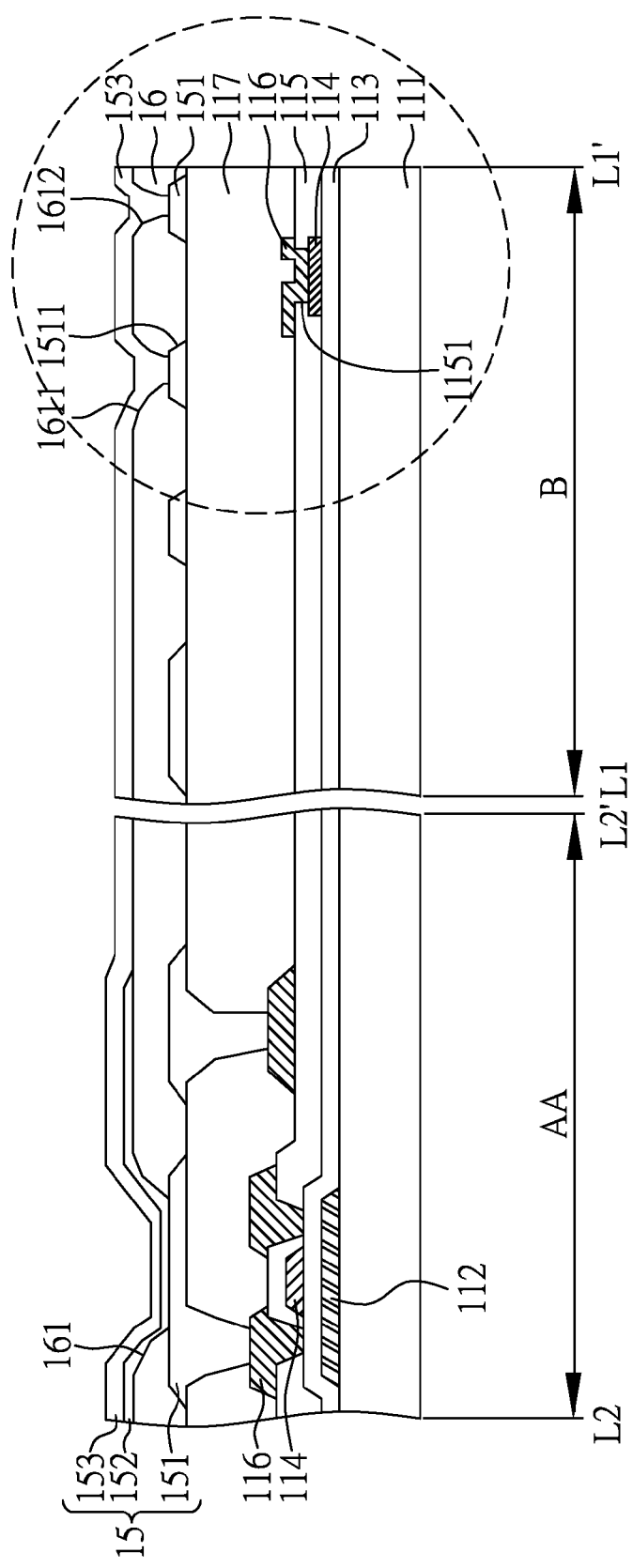
FIG. 6 is a cross-sectional view of an OLED display device along the lines L1-L1' and L2-L2' shown in FIG. 2, according to another embodiment of the present invention.
Figure 7:
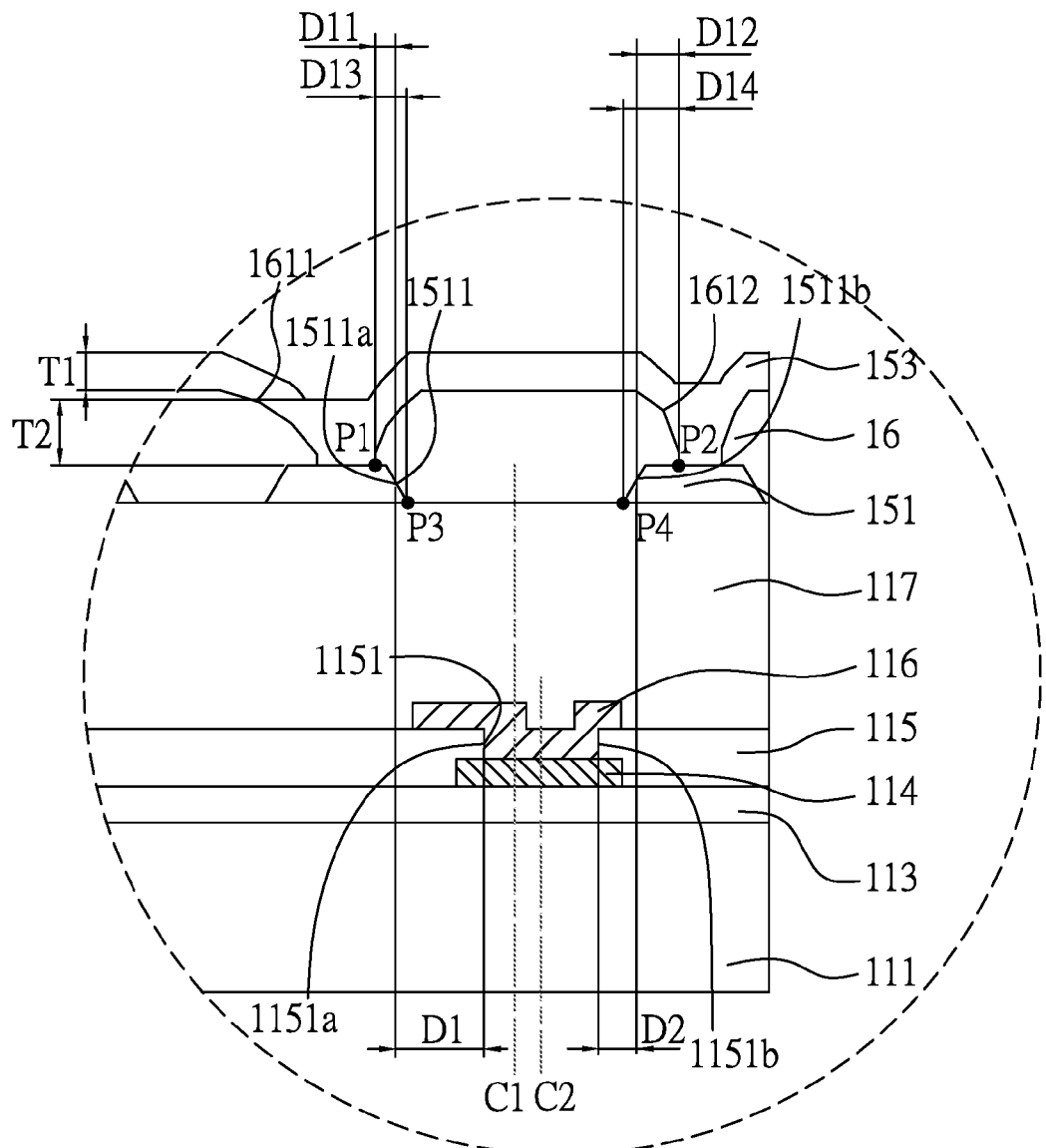
FIG. 7 is an enlarged view of the region indicated by the dot circle shown in FIG. 6.

FIG. 6 is a cross-sectional view of an OLED display device along the lines L1-L1' and L2-L2' shown in FIG. 2, according to another embodiment of the present invention; and FIG. 7 is an enlarged view of the region indicated by the dot circle shown in FIG. 6. The OLED display device of the present embodiment is similar to that shown in FIGS. 3 and 6, except that the diameter of the first opening 1511 in the present embodiment is larger than that in the previous embodiment shown in FIGS. 3 and 6. In the present embodiment, the diameter of the first opening 1511 is increased to approximately expose the whole second metal layer 116.

In the aforementioned embodiments of the present invention, the "cross-section" of the display device is obtained according to a line that the first opening 1511 has the maximum diameter; and the display device of the present invention has the aforementioned features under the "cross-section" of this definition.

The display panel provided by the aforementioned embodiments can be co-used with a touch panel, to form a touch display device.

In addition, the display device provided by the present invention can be applied to any electronic device for displaying images, such as a mobile phone, a notebook, a camera, a video camera, a music player, a navigation system, or a television.

Although the present invention has been explained in relation to its embodiment, it is to be understood that many other possible modifications and variations can be made without departing from the spirit and scope of the invention as hereinafter claimed.

What is claimed is:
1. A display device, comprising:
 a substrate with a display region and a border region surrounding the display region;
 a first metal layer disposed on the substrate;
 a first insulating layer disposed on the first metal layer and having a first contact via on the border region;
 a second metal layer disposed on the first insulating layer and in the first contact via to electrically connect to the first metal layer;

a second insulating layer disposed on the second metal layer; a first electrode layer disposed on the second insulating layer and having at least one first opening on the border region;

a third insulating layer disposed on the first electrode layer and having a second opening on the border region;

a second electrode layer disposed on the third insulating layer and in the second opening to electrically connect to the first electrode layer, wherein the first contact via corresponds to the first opening; and wherein in a cross-section of the display device, the first opening has a first side and a second side opposite to the first side, the first contact via has a third side and a fourth side opposite to the third side, the first side is relatively close to the third side, the second side is relatively close to the fourth side, and a distance between the first side and the third side is different from that between the second side and the fourth side, wherein in the cross-section of the display device, the first opening has a first central line, the first contact via has a second central line, and the first central line is not overlapped with the second central line.

2. The display device as claimed in claim 1, wherein the second opening and the first opening are not aligned to each other.

3. The display device as claimed in claim 1, wherein the third insulating layer further has a third opening, and the first opening locates between the second opening and the third opening, wherein, in the cross-section of the display device, the third insulating layer covers the first electrode layer and has a curved surface between the second opening and the third opening, wherein, in the cross-section of the display device, the curved surface has a first end and a second end, a first distance is between the first end and the first side, a second distance is between the second end and the second side, and the first distance and the second distance are different.

4. The display device as claimed in claim 1, wherein a thickness of the second electrode layer on the third insulating layer is different from another thickness thereof in the second opening.

5. The display device as claimed in claim 1, wherein the display device is an OLED display device.

6. A display device, comprising:
a substrate with a display region and a border region surrounding the display region;
a first metal layer disposed on the substrate;
a second metal layer disposed on the first metal layer;
a first insulating layer disposed between the first metal layer and the second metal layer, wherein the first insulating layer has a first contact via, and the second metal layer is disposed in the first contact via to electrically connect to the first metal layer;

a second insulating layer disposed on the second metal layer; a first electrode layer disposed on the second insulating layer and having a first opening on the border region;

a second electrode layer disposed on the first electrode layer;

a third insulating layer disposed between the first electrode layer and the second electrode layer, and further disposed in the first opening to contact with the second insulating layer, wherein the first contact via corresponds to the first opening;

wherein in a cross-section of the display device, the first opening has a first side and a second side opposite to the first side, the first contact via has a third side and a fourth side opposite to the third side, the first side is relatively close to the third side, the second side is relatively close to the fourth side, and a distance between the first side and the third side is different from that between the second side and the fourth side, wherein in the cross-section of the display device, the first opening has a first central line, the first contact via has a second central line, and the first central line is not overlapped with the second central line.

7. The display device as claimed in claim 6, wherein the second opening and the first opening are not aligned to each other.

8. The display device as claimed in claim 6, wherein the third insulating layer further has a third opening, and the first opening locates between the second opening and the third opening, wherein, in the cross-section of the display device, the third insulating layer covers the first electrode layer and has a curved surface 5 between the second opening and the third opening, wherein, in the cross-section of the display device, the curved surface has a first end and a second end, a first distance is between the first end and the first side, a second distance is between the second end and the second side, and the first distance and the second distance are different.

9. The display device as claimed in claim 6, wherein a thickness of the second electrode layer on the third insulating layer is different from another thickness thereof in the second opening.

10. The display device as claimed in claim 6, wherein the display device is an OLED display device.

* * * * *